United States Patent [19]

Lewis

[11] Patent Number: 4,628,222
[45] Date of Patent: Dec. 9, 1986

[54] PROTECTION OF SAW DEVICES COMPRISING METALLIZED REGIONS ON DIELECTRIC SUBSTRATES

[75] Inventor: Meirion F. Lewis, Malvern, England

[73] Assignee: National Research Development Corporation, London, England

[21] Appl. No.: 585,166

[22] Filed: Mar. 1, 1984

Related U.S. Application Data

[62] Division of Ser. No. 396,900, Jul. 8, 1982, Pat. No. 4,448,805.

[30] Foreign Application Priority Data

Nov. 17, 1980 [GB] United Kingdom ............... 8036806
Oct. 12, 1981 [WO] PCT Int'l Appl. ...PCT/GB81/00222

[51] Int. Cl.[4] .................... H03H 9/25; B05D 5/12
[52] U.S. Cl. ........................... 310/313 R; 29/25.35; 333/153
[58] Field of Search ............ 29/25.35; 310/313 R; 333/153; 427/100; 428/651

[56] References Cited

U.S. PATENT DOCUMENTS 4,330,768  5/1982  Huang et al. ............... 333/153
4,445,805  5/1984  Lewis ......................... 427/100

Primary Examiner—Patrick R. Salce
Assistant Examiner—D. L. Rebsch
Attorney, Agent, or Firm—Cushman, Darby & Cushman

[57] ABSTRACT

In devices comprising closely spaced metallized regions deposited upon a dielectric substrate, in particular acoustic wave devices, electric fields may arise between the regions due to pyroelectric effects or acquired static charges during production or subsequently. These fields can cause damage by arcing or cracking of the substrate. The present method overcomes this problem by providing resistive links between such regions so that the fields do not arise. Preferably the links are of metallizing formed simultaneously with the metallized regions. Application to a SAW convolver is described in which the links are strips of metallizing (7,8,9).

20 Claims, 1 Drawing Figure

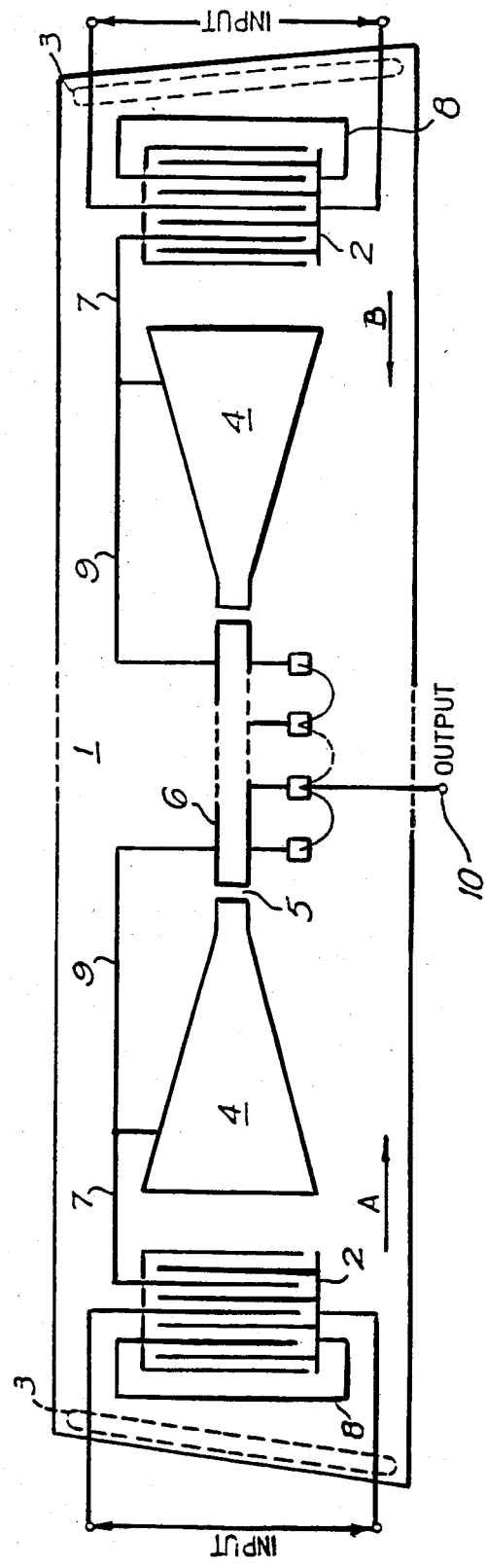

PROTECTION OF SAW DEVICES COMPRISING METALLIZED REGIONS ON DIELECTRIC SUBSTRATES

This application is a division of Ser. No. 396,900, filed July 8, 1982, now U.S. Pat. No. 4,448,805.

This invention relates to methods of producing devices having metallized regions on dielectric substrates, particularly but not exclusively acoustic wave (AW) devices, including surface acoustic wave (SAW) devices, and in particular to the prevention of damage to such devices.

AW devices are known in which a slice of dielectric material has formed on its surface a number of metalized regions which form the elements of the device. The elements interact with the acoustic waves both to modify the wave and to provide input and output transducers. Devices of this type are described, for example, in 'SAW Passive Interdigital Devices', editor D P Morgan, IEE Reprint Series 2 1976 and 'Acoustic Surface Waveguides-Analysis and Assessment' by P E Leagasse et al, IEEE Transactions MTT-21, vol. 21, No. 4, April 1973 at page 225 et seq. In most such devices the material employed as the substrate is piezoelectric and is normally an electrical insulator with very high resistivity. On non-piezoelectric materials, SAW devices may be produced in other ways, e.g., by first depositing a piezoelectric film of such substances as ZnO or AlN; in some AW devices metallized regions may be formed directly on non-piezeoelectric dielectric materials, e.g., on glass. It is often desirable to use substrate materials that have a high efficiency; that is, a good conversion efficiency between electrical and acoustic energy and a low propagation loss in the acoustic medium. It is often the case that materials displaying these properties are also pyroelectric.

A disadvantage of manufacturing AW devices on pyroelectric substrates is that during the manufacturing process the substrate is changed in temperature, as a result of the steps of the manufacturing process, which leads to a separation of charge in the substrate. The areas of metallization which form the individual elements tend to take up a voltage related to the total charge in the underlying substrate. However, because of the high substrate resistivity the charge stored is unable to leak away quickly and hence the charge may attempt to neutralize itself by an arc discharge between adjacent metallized regions of the device. The field produced by the charge may also damage the substrate mechanically, even if arcing does not occur. Electron microscopy has shown that the field can cause cracking and rupture of the substrate at the edge of the metallization, and that arcing can damage the metallization and possibly the substrate. Damage of this type causes an interruption of the acoustic wave or the wave to be modified in an undesirable way, leading to device failure or performance degradation.

It is believed that similar effects can arise with other substrates made of any dielectric material, due to static charges arising in the manufacturing process or in use or in storage. It is particularly likely that these deleterious effects can arise in other dielectric substrates which are piezoelectric without necessarily being pyroelectric, since in such materials electric fields produce mechanical stress or strain. (Pyroelectric materials are normally also piezoelectric). However, damaging effects may also arise with non-piezoelectric substrates.

It is an object of the present invention to overcome or at least substantially reduce these problems by preventing the establishment of damaging electric fields between the metallized regions.

According to the present invention a method of producing a device comprising a dielectric substrate and metallised regions superimposed upon the substrate constituting elements of the device, comprises forming at least one resistive link joining at least two otherwise mutually insulated metallized regions, said link being inessential to the function of the device but being effective to prevent the establishment of a damaging electric field between adjacent metallized regions. Usually the two metallized regions thereby joined are adjacent one another. Preferably the resistive links are strips of metallizing and preferably are formed at the same time as the metallized regions.

The substrate may be piezoelectric or pyroelectric or both, and the said charge separation may be a result of the said piezoelectric or pyroelectric properties. The device may be an AW device, suitably a SAW device.

The charge separation effected within the substrate causes the metallized regions to take up a voltage related to the charge below the regions. In many AW devices the gaps between the metallized regions are very small; in the case of radiofrequency AW devices the gaps are of the order 10 $\mu$m and may be less than 1 $\mu$m. A resistive link of suitable value between the metallized regions ensures that the regions are maintained at substantially the same electrical potential and so ensures that the field or voltage gradient necessary for arcing, cracking or rupture does not exist.

Preferably all the metallised regions which constitute the elements of part-elements of the device are interconnected by resistive links.

AW devices often employ interdigital input and output transducers which consist of two metallized regions. In accordance with the invention the two regions may be connected by a resistive link in order to prevent the above effects. Also, interconnection of the input and output elements via the present links will normally involve some resistive coupling between the input and output of the device. It is necessary to ensure that the values chosen for the resistive links are such that the operation of the device is not substantially impaired.

A preferred method of producing the metallized regions and the resistive links is by the well known technique of photolithography; however other methods such as evaporation through a mask may be employed.

In one application of the invention to a known form of SAW convolver in which the elements of the device comprise a pair of input interdigital transducers, a pair of horns which receive and focus the respective transducer outputs, and an acoustic waveguide whose opposite ends receive the respective horn outputs, resistive links in accordance with the present invention are formed at least between the horns and the waveguide, and preferably also between each horn and its adjacent input transducer and between the two sets of digits of each input transducer. The latter arrangement ensures that at all times during the manufacturing process the metallized regions of the substrate are maintained at a substantially uniform potential and enables the invention to be adopted without adding any new steps in the manufacturing process. The cost of adopting the invention is therefore very small.

The problem of thermal changes, causing charge separation, is most apparent during the manufacturing process; however it may still be a problem if the device suffers changes in temperature during its operation. It may be observed that, if the device in use is to operate under substantially constant temperature conditions, the resistive links become superfluous after manufacture and could in principle be removed or interrupted. However, this is not recommended unless a suitable electrical path is first established via external circuits, because otherwise fields due to static charges may arise subsequently. The external path will usually be resistive, but one of sufficient capacitance may also be effective.

The value of the resistance of the resistive links is chosen as a compromise between a low value which would involve significant loss of signal or large coupling between input and output elements and very high values which would not enable the charge to leak quickly enough to prevent damaging fields arising. There is a practical limitation on making large-value resistive links in that they require very narrow or very long links which are difficult to make and to accommodate on the substrate.

The time-constant ($\tau$) of the external cycles affecting the substrate is of the order of seconds and the stray capacitance (C) of the adjoining elements is of the order of picofarads. Applying the well-known relationship that for adequate damping of such thermally-produced transients $\tau >> RC$, resistance (R) values of less than $10^{12}$ ohms are indicated. If the value chosen is too low, significant electrical coupling between the metallized regions occurs causing loss of signal or degrading performance. These effects are mitigated by choosing the highest value of resistance, consistent with the $\tau >> RC$ limitation, that can be practically produced. In the preferred method of construction, photolithography, the limitation is the length and width of the strip and in the particular embodiment to be described the maximum resistance employed is 1000 ohms.

In many SAW devices the input transducer is fed from a 50 or 75 ohm cable. It is therefore advisable to ensure that the resistive links are of a value well in excess of these figures so that significant power loss is avoided.

The metallized regions and strips may as conventionally consist of aluminium or preferably aluminium with a chromium underlayer, which has the effect of improving adhesion of the aluminium to the substrate. The metallized regions and strips may however be made of other metals well known in the art for such purposes, such as gold.

Instead of the resistive links being discrete strips of metallising, they may be constituted by a substantially uniform relatively high-resistance coating extending between the elements of the device. This coating may be metallizing deposited substantially uniformly over the substrate before the metallising which forms the elements, and may be a coating which serves to improve the adhesion of the latter.

The present invention further provides a device as aforesaid when made by a method as aforesaid.

The invention will now further be described by way of example only with reference to the accompanying schematic diagram, which is a diagrammatic plan view of a SAW convolver embodying the present invention. The drawing shows a form of SAW convolver of a type described in 'Wideband LiNbO₃ Electronic Convolver with Parabolic Horns' by R. A. Becker and D. H. Hurlburt, Proceedings of 1977 IEEE Ultrasonics Symposium (Catalogue No. 79CH1482-9SU) at page 729 et seq, with the addition of resistive links between elements thereof in accordance with the present invention.

The FIGURE is a plan drawing of a typical convolver.

Referring to the drawing, the device comprises a substrate 1 with piezoelectric and pyroelectric properties. The substrate is made of a single crystal of lithium niobate (LiNbO₃) cut so that the axis of the device, along which the surface acoustic waves travel, is along the Z direction of the crystal in the Y plane. The substrate is cut so as to leave nonparallel edges, in order that any reflection of acoustic waves is unlikely to interfere with the waves that the elements are acting upon.

The crystal has superimposed upon its top surface a pair of interdigital input transducers 2 for launching acoustic waves in the directions A and B respectively. The transducers are formed as metallized regions on the substrate. The acoustic waves are focused by the horns 4 shown schematically in the FIGURE, also formed as metallized regions on the substrate. Concentrated beams of acoustic energy are launched across the gaps 5 into the acoustic waveguide 6, also formed as a metallized region on the substrate. The counter-propagating beams interact in a non-linear fashion in the waveguide forming a convolution signal. The input transducers, the horns and the acoustic waveguide constitute the elements of the device. The edges of the substrate at the rear of both the input transducers 2 are coated with an acoustic absorbent material in order to reduce the backscatter of acoustic energy from the edge of the crystal.

The convolver waveguide 6 consists of a metallized region typically three acoustic wavelengths wide and of a length determined by the duration of the wavetrains to be convolved. The width is a compromise with respect to convolution efficiency, multimoding effects and dispersion of the principal mode. The convolver output 10 is taken from the convolver waveguide 6. In order to reduce resistive losses and optimize uniformity in the output, the waveguide is 'stich-bonded' along its length and the ends of the waveguide are reactively terminated. The techniques involved in reactive terminations are described by J H Goll and R C Bennett in IEEE Ultrasonics Symposium 1978 at page 44.

In one example, the input transducers 2 are phase-weighted in order to achieve a bandwidth of 90 MHz, while maintaining a substantially uniform acoustic profile into the horns. The transducers are tuned with a single series coil (not shown). The weighting technique has been described by M F Lewis in Electronics Letters 9 (1973) at page 138 and by T W Bristol in IEEE Ultrasonics Symposium (1972) at page 377.

The gap 5 between the horn and the convolver waveguide is about one acoustic wavelength wide. This is a compromise between a wide gap in which the acoustic energy from the horn diverges before it passes under the convolver waveguide and a gap too narrow so that significant capacitative coupling between the input and output of the device occurs.

The device as so far described will be known to those skilled in the art. If is found however that in manufacturing the metallized regions of the device by processes which involve changes in the temperature of the substrate, for example during the stages of photolithography, voltages are generated in adjacent metallized regions which tend to cause cracking and/or arcing between the metallized regions, as described earlier. The narrow gaps 5 between the horn and the convolver waveguide are particularly vulnerable in this respect but the same is true to a lesser degree of the other gaps in the device, for example within the transducers. The problem is further complicated by temperature gradients which may be produced within the substrate during manufacture.

In accordance with the present invention the metallized regions of the device 2, 4, 6, are interconnected by thin strips of metallizing 7, 9 and the two inter-digital regions of each input transducer 2 are interconnected by a thin strip of metallizing 8, which form resistive links. The links are formed by photolithography at the same time as the other metallized regions of the device, ie a uniformly metallized substrate, in this embodiment metallized with aluminium, is selectively etched to form simultaneously the resistive links and the other metallized regions of the device. The links are thus of the same thickness as the latter regions, and are made as narrow as possible in order to maximize their resistance. In one example they are 3 μm wide.

It should be noted that the resistive link 8 is directly connected across the input terminals of the device. This has little effect on the device performance, provided the resistance of the link 8 is large compared with the transducer and source impedance. In one example, however, the shunt impedance of each transducer 2 is about 5000 ohms, and the 1000 ohm links 8 were therefore broken, once an electrical path was established in the external circuit. The link can be broken by, for example, scratching across it, or by using chemical etching to dissolve, or a laser flash to evaporate, a small portion of the link.

In the described example, the resistive links are discrete strips of metallizing, eg 7, 8 and 9. Alternatively, the resistive links may be constituted by a substantially uniform relatively high-resistance coating of material, suitably metallizing, extending between the elements (formed of relatively low-resistance metallizing) of the device. The latter may then be regarded as low-resistance "islands" in a high-resistance "sea". The high-resistance coating may be a coating of metallizing deposited before the metallizing which forms the elements, in order to improve the adhesion of the latter, for example a chromium coating over which aluminium is coated to form the elements. Such a device may be produced by first coating the substrate uniformly with chromium and then coating aluminium uniformly over the chromium. The aluminium is then selectively etched to form the elements of the device, the etchant being selected to etch the aluminium but not the chromium so that the chromium coating provides resistive links between the elements in accordance with the invention. The thickness of the chromium coating must be sufficiently small to prevent substantial impairment or degradation of the performance of the device by having too low a resistance.

The invention has been described in relation to a SAW device, but its application is not limited to such devices. For example it is also applicable to bulk AW devices (see Yen et al, Proc 1979 IEEE Symp on Ultrasonics, pp 776-785) and to acousto-optical or optical devices (see Abramovitz et al, 1980 Ultrasonics Symp, pp 483-487), and indeed to any sort of device which involves closely spaced metallized regions deposited on dielectric materials where fields between adjacent regions resulting from static or other unwanted charges can cause damage by arcing or otherwise. Although the metallized regions between which the resistive links are connected will normally be the adjacent regions, circumstances can be envisaged in which this need not necessarily be so, eg regions either side of a third region might be interconnected by a resistive link to bring them to the same potential as the third.

I claim:

1. In a surface acoustic wave device having at least two thin film structures disposed on the surface of a substrate, there being a gap between said structures, said structures being arranged so that a surface acoustic wave traversing a first of said structures is communicated across said gap to the second of said structures, and a thin film loop electrically shunting said gap to prevent cracks in the gap region of said substrate from being induced during fabrication of said surface acoustic wave device.

2. The means for preventing cracks of claim 1 wherein said thin film structures are disposed along a longitudinal axis of said surface acoustic wave device, a surface acoustic wave generally traversing along said longitudinal axis, said loop including a pair of electrically conductive legs, each leg of said pair being disposed opposite the other leg of said pair on opposite sides of said gap and generally perpendicular to said longitudinal axis and means electrically bridging the ends of said legs remote from said gap.

3. The means for preventing cracks of claim 1 wherein said loop in an electrically conductive microstrip interconnecting said thin film structures across said gap.

4. The means for preventing cracks of claim 1 wherein the resistance of said loop is significantly greater than the output impedance of said surface acoustic wave device.

5. In a surface acoustic wave convolver having at least one thin film parabolic horn and an interaction channel disposed on a substrate, said horn having a relatively wide input end for receiving a surface acoustic wave incident thereon and a relatively narrow output end which communicates with said interaction channel across a gap and along the surface of said substrate, and a thin film loop electrically shunting said gap to prevent cracks in the gap region of said substrate.

6. The means for preventing cracks of claim 5 wherein said thin film loop extends generally perpendicular to the direction of travel of said surface acoustic wave in said convolver at the interface of the loop with said horn and said interaction channel.

7. The means for preventing cracks of claim 5 wherein the resistance of the loop is significantly greater than the output impedance of said surface acoustic wave convolver.

8. A device comprising a dielectric substrate and metallized regions superimposed on the substrate constituting elements of the device, said device including at least one resistive link connected between at least two other mutually insulated metallized regions, said link being inessential to the required function of the device when subsequently connected into an external circuit but acting to prevent the establishment of a damaging electric field between adjacent ones of said metallized regions due to unwanted dielectric charge storage not arising from in-circuit operation of the device.

9. A device as claimed in claim 8 wherein the two metallized regions are adjacent one another.

10. A device as claimed in claim 9 wherein the links are strips of metallizing.

11. A device as claimed in claim 10 wherein the strips of metallizing are formed at the same time as the two metallized regions.

12. A device as claimed in claim 11 wherein all the metallized regions which constitute elements or part elements are interconnected by said resistive links.

13. A device as claimed in claim 11 having an external circuit connection between the metallized regions linked by said link and having a break in said link, said break having been made after making said external connection.

14. A device as claimed in claim 9 wherein the resistive links are constituted by a substantially uniform relatively high-resistance coating of material extending between the elements of the device.

15. A device as claimed in claim 14 wherein the high-resistance coating is a coating of metallizing deposited substantially uniformly on the substrate before the metallizing which forms the elements.

16. A device as claimed in claim 15 wherein the high-resistance coating is one which serves to improve the adhesion of the metallizing which forms the elements.

17. A device as claimed in claim 16 wherein the substrate is selected from the group consisting of pyroelectric and piezoelectric substrates and substrates which are both pyroelectric and piezoelectric.

18. A device as claimed in claim 17 wherein the device is an acoustic wave device.

19. A device as claimed in claim 11 in which the device is a surface acoustic wave convolver whereof the elements comprise a pair of input interdigital transducers, a pair of horns which receive and focus the respective transducer outputs, and an acoustic waveguide whose opposite ends receive the respective horn outputs, said device including said resistive links at least between each horn and the waveguide.

20. A device as claimed in claim 19 and also including said resistive links formed between each horn and its adjacent input transducer and between the two sets of digits of each input transducer.

* * * * *